(12) United States Patent
Chu et al.

(10) Patent No.: US 6,774,010 B2
(45) Date of Patent: Aug. 10, 2004

(54) TRANSFERABLE DEVICE-CONTAINING LAYER FOR SILICON-ON-INSULATOR APPLICATIONS

(75) Inventors: Jack Oon Chu, Manhasset Hills, NY (US); Alfred Grill, White Plains, NY (US); Dean A. Herman, Jr., Garrison, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/769,170

(22) Filed: Jan. 25, 2001

(65) Prior Publication Data

US 2002/0096717 A1 Jul. 25, 2002

(51) Int. Cl.⁷ ............................................. H01L 29/72
(52) U.S. Cl. ..................... 438/458; 438/455; 438/459; 257/317; 257/318; 257/319; 257/347; 257/360
(58) Field of Search ................................ 438/455, 458, 438/459; 257/317, 318, 319, 360, 347, 348, 349

(56) References Cited

U.S. PATENT DOCUMENTS

| | | | |
|---|---|---|---|
| 5,374,564 A | 12/1994 | Bruel | 437/24 |
| 5,399,231 A | 3/1995 | McCarthy | 156/630 |
| 5,528,397 A * | 6/1996 | Zavracky et al. | 257/347 |
| 5,674,758 A | 10/1997 | McCarthy | 437/21 |
| 5,710,057 A | 1/1998 | Kenney | 437/62 |
| 5,856,229 A * | 1/1999 | Sakaguchi et al. | 257/347 |
| 5,876,497 A | 3/1999 | Atoji | 117/85 |
| 5,877,034 A | 3/1999 | Ramm et al. | 438/15 |
| 5,882,987 A | 3/1999 | Srikrishnan | 438/458 |
| 5,886,078 A * | 3/1999 | Sullivan et al. | 257/347 |
| 5,906,951 A | 5/1999 | Chu et al. | 438/751 |
| 5,994,207 A | 11/1999 | Henley et al. | 438/515 |
| 6,033,974 A | 3/2000 | Henley et al. | 438/526 |

FOREIGN PATENT DOCUMENTS

| | | | |
|---|---|---|---|
| DE | 197 30 975 A1 * | 1/1999 | 257/347 |
| JP | 96264386 | 6/1997 | |

OTHER PUBLICATIONS

K. Sakaguchi et al., "SOI Wafers Epitaxial Technology", Solid State Technology, Jun. 2000, pp. 88–92.

* cited by examiner

Primary Examiner—Edward Wojciechowicz
(74) Attorney, Agent, or Firm—Scully, Scott, Murphy & Presser; Robert M. Trepp, Esq.

(57) ABSTRACT

A method for forming an integrated circuit on an insulating substrate is described comprising the steps of forming a semiconductor layer on a seed wafer substrate containing an at least partially crystalline porous release layer, processing the semiconductor layer to form a "transferable" device layer containing at least one semiconductor device, and bonding said transferable device layer to a final, insulating substrate before or after separating said device layer from the seed wafer substrate. A second method, for separating a semiconductor layer from a seed wafer substrate, is described wherein an at least partially crystalline porous layer initially connecting the semiconductor layer and seed wafer substrate is split or broken apart by the steps of (i) introducing a fluid including water into the pores of said porous layer, and (ii) expanding said fluid by solidifying or freezing to break apart the porous layer. The at least partially crystalline porous layer may incorporate at least one porous silicon germanium alloy layer alone or in combination with at least one porous Si layer. Also described is an integrated circuit comprising the transfered device layer described above.

30 Claims, 5 Drawing Sheets

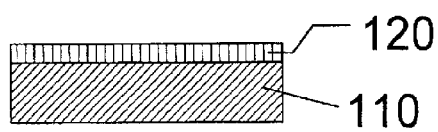
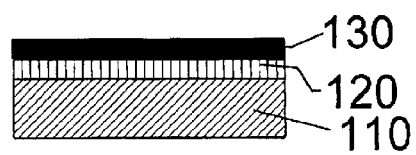
FIG 2A                FIG 2B
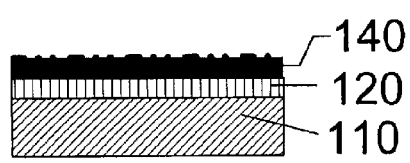
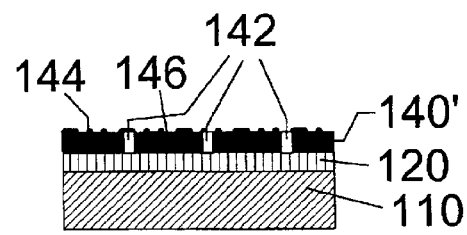
FIG 2C                FIG 2D
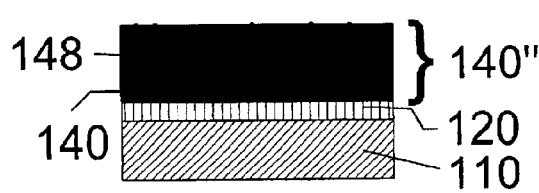
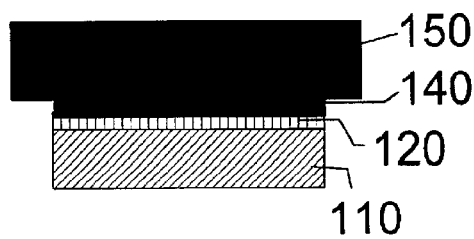
FIG 2E                FIG 2F

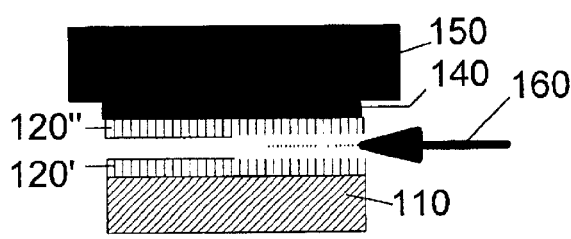
FIG 2G
FIG 2H
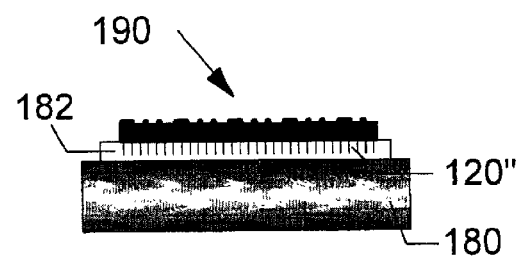
FIG 2I
FIG 2J

TRANSFERABLE DEVICE-CONTAINING LAYER FOR SILICON-ON-INSULATOR APPLICATIONS

CROSS REFERENCE TO RELATED APPLICATIONS

Cross reference is made to U.S. application Ser. No. 09/675840 (Attorney Docket YOR920000345US1) filed Sep. 29, 2000 by J. O. Chu et al. entitled "Preparation of Strained Si/SiGe On Insulator by Hydrogen Induced Layer Transfer Technique" which describes separating two substrates at an H-rich defective layer and is assigned to the assignee herein.

Further cross reference is made to U.S. application Ser. No. 09/692606 (Attorney Docket YOR920000344US1) filed Oct. 19, 2000 by J. O. Chu et al. entitled "Layer Transfer of Low Defect SiGe Using An Etch-back Process" which describes bonding two substrates together via thermal treatments and transferring a SiGe layer from one substrate to the other via highly selective etching using SiGe itself as the etch-stop.

FIELD OF THE INVENTION

The present invention generally relates to "silicon-on-insulator" (SOI) technology in which the semiconductor devices such as CMOS and bipolar transistors in a device layer are spaced apart from underlying conducting or semiconducting substrate layers to reduce substrate capacitance effects. More particularly, this invention relates to a method for forming a transferable device-containing layer that may be bonded to any type of substrate, and to the use of this method for forming integrated multifunctional systems-on-a-chip on insulating substrates. A second aspect of the invention relates to methods for separating a semiconductor layer from a substrate, and more particularly to ELTRAN (Epitaxial Layer TRANsfer)-related methods for forming and breaking apart a porous layer which initially connects or is between the semiconductor layer and substrate.

BACKGROUND OF THE INVENTION

As semiconductor devices shrink to smaller dimensions, device speeds increase and substrate capacitance effects become an increasingly large contributor to device cycle times. This problem is typically addressed by building "silicon on insulator" (SOI) devices, where a thin (~200 nm), single crystal Si device layer containing the devices is situated on an insulating substrate layer or substrate instead of directly on Si. It should be noted that for the purposes of this invention, we use the term "device layer" to refer to the (nominally) single crystal semiconductor layer in which devices may be built, and that at different times during processing a given device layer may or may not actually have devices in it.

While semiconductor device layers can be grown epitaxially on single-crystal insulating substrates, "Silicon On Sapphire" (SOS) being a prime example, semiconductor device layers are more typically formed in a Buried OXide (BOX) geometry, in which an amorphous oxide (typically $SiO_2$) is sandwiched between a thin semiconductor device layer and a Si wafer substrate. BOX geometry wafers may be produced by "Separation by IMplantation of OXygen" (SIMOX), where a buried SiOx layer is formed by ion implantation of oxygen, and the device layer through which the ions have passed is repaired by a recrystallization anneal. BOX approaches also include several wafer bonding techniques. In conventional bonding terminology, which we will use here, an epitaxial device layer is grown on a sacrificial "seed wafer." The device layer is then detached from the seed wafer after it is bonded to a "handle wafer" which will accompany the device layer through the processing steps needed to fabricate the devices. Bonding techniques for BOX SOI include (i) Smart-Cut® (where H implants are used to separate the device layer from the seed wafer after the device layer is bonded to a surface oxide on the handle wafer), (ii) BESOI ("Bond-Etchback SOI," where the seed wafer is removed by etching after the device layer is bonded to an oxide layer on the handle wafer), and (iii) ELTRAN ("Epitaxial Layer TRANsfer," where the seed wafer contains a porous Si layer on which the device layer is first grown, then partially oxidized, and then finally bonded to the handle wafer, after which the device layer is separated from the seed wafer by a collimated water jet which breaks apart the porous Si layer. These and other wafer bonding methods are described in U.S. Pat. No. 5,710,057, issued Jul. 12, 1996 to D. M. Kenney. Smart-Cut® process is described in U.S. Pat. No. 5,374,564 by M. Bruel which issued Dec. 20, 1994 and in U.S. Pat. No. 5,882,987 by K. V. Srikrishnan which issued Mar. 16, 1999. BESOI SOI is described in U.S. Pat. No. 5,906,951 by Chu et al. which issued May 25, 1999.

However, a problem with using SOI substrate wafers made by these techniques is that the processing to form the devices in the device layer is done after the device layer has been bonded to (or grown on) a handle wafer which also acts as the final substrate for the devices. The handle wafer must thus be able to survive the processing steps required to form the devices (e.g., activation anneals, etc.).

Unfortunately, few wafer substrate materials are sufficiently compatible with the high temperatures and temperature cycling of Si processing. Highly insulating (>1 k$\Omega$-cm) Si wafer substrates are potentially suitable substrates, but they are expensive and easily warped (a problem for lithography) compared to conventional lightly doped (10 to 100 $\Omega$-cm) Si wafers. Sapphire wafer substrates are also expensive, and present concerns about thermal expansion mismatches between Si and sapphire ($Al_2O_3$). In addition, the epitaxially-grown Si layers in SOS wafers typically have a high density of defects, due to imperfect lattice matching of the Si and sapphire ($Al_2O_3$).

BOX approaches typically use lightly doped Si wafer substrates with a buried $SiO_2$ layer as the insulator. While the Si wafer substrate is completely compatible with Si device processing, the $SiO_2$ layer must be thin, both to reduce thermal mismatch stresses to the Si device layer during processing, and to prevent thermal isolation of the device layer (and device heating) during device operation. BOX approaches using $SiO_2$ as the buried oxide are thus of limited value in spacing apart the device layer from the Si wafer substrate. More thermally conductive materials such as $Al_2O_3$, AlN, or diamond may be used as a thicker insulating "BOX" layer, but concerns about thermal expansion mismatches again remain.

These difficulties with building SOI devices on SOI substrate wafers can be circumvented by transferring the device layer to the substrate of choice after the devices have been formed in the device layer. Previous implementations of this approach include (i) U.S. Pat. No. 5,877,034, "Method of making a three-dimensional integrated circuit," issued Mar. 2, 1999 to Ramm and Buchner, which describes fabricating a device-containing device layer (including optional interconnection layers) on a first substrate, transferring device layer to an auxiliary substrate, removing the first substrate by a "thickness reduction" process comprising polishing or grinding, bonding the device to a final substrate, and, finally, removing the auxiliary substrate, and (ii) U.S. Pat. No. 5,674,758, "Silicon on insulator achieved using electrochemical etching," issued Oct. 7, 1997 to McCarthy, which describes forming a device-containing device layer on a first substrate, transferring it to a final substrate, and removing the first substrate by standard etching techniques in combination with electrochemical etching techniques. However, these approaches require a sacrificial wafer which cannot be reused, as well as stringent endpoint control to avoid continuing the sacrificial wafer etch into the device layer. The use of a sacrificial release layer between the device-containing device layer and its original substrate allows reuse of the original substrate. This sacrificial release layer approach, exemplified by U.S. Pat. No. 5,528,397, "Single crystal silicon transistors for display panels," issued Jun. 18, 1996 to Zavracky et al., typically requires a thermally stable release layer (e.g., $SiO_2$), and the use of channels or grooves in the device layer to provide a path for the etchant to reach and dissolve away the release layer. However, the need for grooves, and concerns about device damage from the release layer etchant are disadvantages of this approach. It would therefore be desirable to have an improved method for transferring device-containing device layers from one substrate to another.

BOX approaches to forming SOI wafer substrates that are based on bonding a semiconductor device layer to a handle wafer require a method for separating a semiconductor layer from the seed wafer substrate. In the prior art ELTRAN process, separation is accomplished by breaking apart a porous layer which initially connects the semiconductor layer to the seed wafer substrate. A schematic of the ELTRAN process based on the description of K. Sakaguchi and T. Yonehara in Solid State Technology, June 2000, p. 88 is shown in FIGS. 1A–1G. FIG. 1A shows silicon seed wafer 10 after formation of porous silicon layer 20. A high-quality epitaxial Si layer 30 (the device layer) is then grown on porous silicon layer 20 to form the structure of FIG. 1B. A portion of silicon layer 30 is then thermally oxidized to form thermal oxide layer 40 shown in FIG. 1C. The structure of FIG. 1C is then bonded to Si handle wafer 50 to form the 2-wafer structure of FIG. 1D. Porous Si layer 20 is then split by a pressurized water jet 60, as shown in FIG. 1E, to form the structure of FIG. 1F with handle wafer 50, thermal oxide layer 40, device layer 30, and residual porous Si layer 20'. FIG. 1G shows the final SOI structure obtained after removing residual porous Si layer 20', and etching/annealing the device layer to make it smooth and flat.

While this traditional ELTRAN approach to forming SOI wafer substrates has been successfully demonstrated, several aspects are open to improvement. To ensure a porous silicon layer that can be cleanly broken, ELTRAN typically employs a double layer of porous silicon comprising a first porous Si layer with a first porosity, and a second porous Si layer with a different porosity. High stress concentrations are present at the interface between the two porous Si layers, an arrangement that facilitates wafer splitting, since wafer splitting will relieve the stress. However, it can be difficult to engineer the appropriate stress differentials so that the porous silicon is weak enough to split with the water jet yet strong enough to survive processing. It would be desirable to have another method of designing porous Si-based layers that can be easily and controllably split apart. Another concern with the traditional ELTRAN approach is water jet alignment; careful alignment is needed to ensure that the water jet impinges only on the porous silicon layer and does not attack the device layer or seed wafer surface. It would be desirable to have a splitting process that does not require any alignment.

In view of the above-described circumstances it is therefore an object of this invention to provide an improved method for forming structures comprising thin device-containing device layers on insulating or specialty substrates selectable without regard to the substrate's compatibility with silicon processing.

It is a further object of this invention to provide a thin device-containing device layer on an insulating or specialty substrate for use as an integrated multifunctional system-on-a-chip.

It is an additional object of this invention to provide an alternative to the ELTRAN method for separating a semiconductor layer from a substrate, and more particularly to improved methods for forming and splitting or breaking apart the porous layer by which the semiconductor layer and substrate are initially joined or connected.

SUMMARY OF THE INVENTION

The present invention provides an improved method for forming structures containing device-containing device layers that have been transferred from one substrate to another. The method comprises a novel combination of (i) prior art concepts for forming structures containing transferred device-containing device layers, (ii) prior art methods for building device-containing device layers, and (iii) the prior art ELTRAN technique for separating a device-free device layer from its original substrate. In one method of the present invention, a semiconductor device layer (e.g., one or more layers of strained or unstrained Si or silicon germanium) is initially grown on a first (seed) substrate containing an at least partially crystalline porous release layer. The device layer is then processed to form a device-containing device layer (which may include isolation regions and interconnects, if desired). The device-containing device layer is next separated from its seed wafer substrate by splitting or breaking apart the porous release layer. This separation step may occur before or after the device layer is bonded to its final substrate (with separation before bonding to the final substrate requiring the use of an additional temporary carrier substrate). This novel use of ELTRAN for separating a device-containing device layer from its substrate requires that the porous release layer survive the device-forming processing steps. In particular, the porous release layer should have sufficient thermal and mechanical stability to not release prematurely or lose its releasing properties during process steps such as high temperature activation anneals and chemical mechanical polishing. These properties of porous silicon were not required or anticipated to be necessary for the original ELTRAN invention, and the best mode of the present invention may require stronger formulations of the porous layer material/structure and more powerful methods for splitting or breaking the porous layer apart.

Like prior methods for forming structures comprising device-containing device layers that have been transferred from one substrate to another, the present method has the advantage that the thin device-containing layer can be bonded to almost any substrate without regard to the substrate's compatibility with Si device manufacturing. In particular, the final substrate may be selected to optimize any one or more of the following properties: mechanical flexibility, electrical resistance, cost, weight, environmental impact, thermal conductivity, cooling power including passive cooling and active cooling.

Another aspect of the present invention pertains to an alternative method for device layer/wafer separation. As in ELTRAN, the epitaxial device layer is grown on a porous Si layer between the semiconductor layer and seed wafer substrate, although with the additional restriction that the porous Si layer be designed to have an open porosity. The device layer (with or without devices in it) is separated from the substrate by breaking up the porous layer with a freeze-thaw technique in which a fluid like water is introduced into the pores and expanded by freezing.

Yet another aspect of the present invention pertains to replacing the porous Si layer with a porous silicon germanium alloy (e.g., $Si_{1-x}Ge_x$, where 0<x<1 may be constant or spatially variable) or at least one porous silicon germanium alloy layer in combination with porous Si. This provides additional flexibility in designing interface strain within the porous release layer, since SiGe layers with different Ge content will have different strains as well as different responses to the anodic etching processes typically employed to induce porosity.

BRIEF DESCRIPTION OF THE DRAWINGS

These and other features, objects, and advantages of the present invention will become apparent upon a consideration of the following detailed description of the invention when read in conjunction with the drawings, in which:

FIGS. 2A–2J show, in cross section view, the method steps of a preferred embodiment of the present invention for forming structures with device-containing device layers on arbitrary substrates;

DESCRIPTION OF THE PREFERRED EMBODIMENTS

Figure 1A:
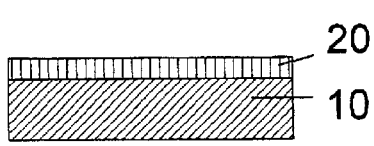
FIGS. 1A–1G show cross section views of the prior art ELTRAN method of SOI wafer formation.
Figure 1B:
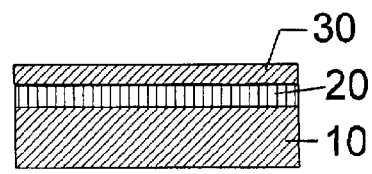
Figure 1C:
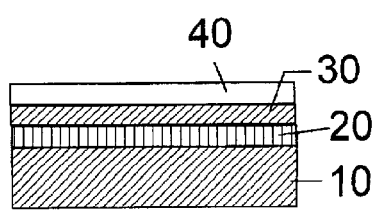
Figure 1D:
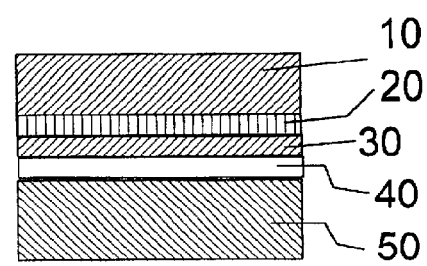

FIGS. 2A–2J show, in cross section view, the method steps of a preferred embodiment of the present invention for forming structures with device-containing device layers on arbitrary substrates. FIG. 2A shows original single-crystal semiconductor substrate 110 after processing to form porous layer 120 which is at least partially crystalline. Porous layer 120 may be formed by any number of methods. A preferred method for forming porous layer 120, useful when substrate 110 is a silicon wafer, is anodic etching in HF-based solution. This method is maskless and low-cost, and the etch conditions can be adjusted so that porous layer 120 has a bilayer structure that is more easily fractured. Porous layer 120 may alternatively be formed by etching through a mask, for example by reactive ion etching (RIE) through a mask formed from self-assembled nanoparticles. While porous layer 120 typically comprises porous Si, the porous layer may alternatively comprise at least one porous silicon germanium alloy (e.g., $Si_{1-x}Ge_x$, where 0<x<1 may be constant or spatially variable) layer alone or in combination with at least one porous silicon layer. If desired, additional elements may also be added to the silicon germanium alloy layer, including B, P, C, and As. As noted earlier, the use of SiGe provides additional flexibility in designing interface strain within the porous release layer, since SiGe layers with different Ge content will have different strains as well as different responses to the anodic etching processes typically employed to induce porosity. It should be noted that the crystal lattice spacing of Ge is 4% greater than the lattice spacing of Si.

Semiconductor device layer 130 is then grown on porous layer 120 to form the structure of FIG. 2B. Semiconductor device layer 130 preferably has a thickness between 20 and 1000 nm, and may be selected from one of the following materials: silicon, silicon-germanium alloys, silicon-carbon alloys, silicon-germanium alloys containing carbon; the aforementioned materials doped with any element; the aforementioned materials in layered or graded composition combinations; the aforementioned materials in single crystal, polycrystalline, or nanocrystalline form.

Semiconductor device layer 130 is then processed to form a device-containing device layer containing at least one semiconductor device, as shown in FIGS. 2C–2E. FIG. 2C shows a generic device-containing device layer 140 on porous layer 120; FIG. 2D is identical to FIG. 2C except for the replacement of layer 140 with a multifunctional device-containing device layer 140' containing optional insulating isolation regions 142 separating device regions 144 and 146 having different functionalities; and FIG. 2E is identical to FIG. 2C except for the replacement of layer 140 with a generic interconnected device-containing layer 140" containing a generic device-containing device layer such as layer 140 plus additional layers of interconnection circuitry 148. Layer 140" may also optionally include additional active or passive components.

The at least one semiconductor device in device-containing device layer 140 may be selected, for example, from one of the following device families: digital devices, analog devices, n-type metal-oxide-semiconductor devices (NMOS), p-type MOS (PMOS), complementary MOS (CMOS) devices, bipolar devices, bipolar and CMOS (BiCMOS) devices, SiGe bipolar or field effect transistors, integrated passive devices including capacitors and inductors, Micro Electro Mechanical (MEMs) devices, voltage controlled oscillators (VCOs), upconverters, downconverters. Multifunctional device-containing device layer 140' may comprise, for example, an integrated multifunctional chip system.

For convenience, the remaining method steps of FIGS. 2F–2J will be shown for the case of a full wafer with the structure of FIG. 2C containing the generic device-containing device layer 140, although the method steps apply equally well to the embodiments of FIGS. 2D and 2E with device-containing layers 140' and 140". FIG. 2F shows the structure of FIG. 2C after it has been temporarily bonded to auxiliary substrate 150. Bonding to the auxiliary substrate may be performed by any method known in the art, for example, by using an easily removable (but preferably non-water soluble) adhesive. Device-containing device layer 140 is then detached from original substrate 110 by breaking apart porous layer 120. This step of breaking apart may be performed by a high-pressure water jet aimed at porous layer 120, as shown by arrow 160 in FIG. 2G. The detached device-containing layer of FIG. 2H (shown with porous layer residuals 120', which may be left in the structure or removed by a process such as by wet or dry etching or CMP) is then bonded to final substrate 180 to form the structure of FIG. 2I. Bonding to the final substrate may be effected by any method known to the art, for example, by using an adhesive layer which may be grown or deposited on one or both of the surfaces to be bonded. It should be noted that bonding with an adhesive layer may be improved if porous residuals 120' are left in the structure, since they will provide an increased surface area for bonding. Completed structure 190 of FIG. 2J is produced by removing the auxiliary substrate 150 from the structure of FIG. 2I by releasing it intact or by methods such as by grinding away, wet or dry etching, CMP or a combination thereof.

Final substrate 180 may be selected to optimize any one or more of the following properties: mechanical flexibility, electrical resistance, cost, weight, environmental impact, thermal conductivity, cooling power including passive cooling and active cooling. Final substrate 180 may be selected from the group including single crystal silicon, diamond, quartz, other crystalline oxides, crystalline or amorphous nitrides, amorphous or glassy oxides, organic materials such as plastics, organic-inorganic composites, etc. Final substrate 180 may alternatively comprise a base substrate with one or more overlayers selected from the group containing highly insulating (>1 kΩ-cm) single-crystal Si or silicon germanium, highly insulating (>1 kΩ-cm) polycrystalline Si or silicon germanium, single crystal or polycrystalline diamond; silicon oxide; aluminum oxide, aluminum nitride, other metal oxides, and mixtures thereof, with the material of the base substrate being selected from the group including single crystal silicon, diamond, crystalline oxides, crystalline or amorphous nitrides, amorphous or glassy oxides, metals, organic materials such as plastics, organic-inorganic composites, etc.

Other embodiments of this invention comprise variations to the method of FIGS. 2A–2J. For example, the full wafers of FIGS. 2C–2E may be diced before bonding to auxiliary substrate 150, or the device layer 140/auxiliary substrate 150 couple of FIG. 2H may be diced into chips prior to the bonding and transfer processes of FIGS. 2I and 2J. In another variation of the method of FIGS. 2A–2J, the auxiliary substrate 150 is omitted; the structure of FIG. 2C is directly bonded to the final substrate (in an up-side-down orientation) prior to splitting or breaking apart the porous layer 120. In addition, while porous layer 120", shown in FIG. 2H, may be beneficial to the adhesion between the device layer 140 and final substrate 180, porous layer 120" can also be removed to achieve, for example, better thermal contact. Removal of porous layer 120" may be performed by processes such as wet or dry etching, chemical mechanical polishing (CMP) or grinding, or a combination of these techniques.

This invention also provides integrated circuit structures formed by the above-described methods and materials. For example, the invention provides integrated circuit structures formed comprising the steps of forming a semiconductor layer on a first substrate, the first substrate comprising a base substrate and an at least a partially crystalline porous release layer;

processing the semiconductor layer to form a device layer containing at least one semiconductor device;

bonding the device layer to a temporary auxiliary substrate;

detaching the device layer from the first substrate by breaking apart the porous release layer;

bonding the device layer to the final substrate; and detaching the device layer from the temporary auxiliary substrate.

The invention further provides integrated circuit structures formed by the steps of the above method modified by the addition of one or more of the following steps: (i) dicing the device-containing device layer 140 into chips prior to bonding the device-containing device layer 140 to the auxiliary substrate 150; (ii) dicing the device-containing device layer 140 while it is on the auxiliary substrate 150, before it is bonded to the final substrate 180; (iii) omitting the auxiliary wafer 150 so that the device-containing device layer 140 is bonded directly (in an up-side-down orientation) to the final substrate 180; (iv) use of one or more adhesion layers 182 which may be grown or deposited on one or both of the surfaces being bonded; and (v) removing porous layer 120" from the underside of the device-containing device layer 140 prior to bonding device layer 140 to final substrate 180.

Another aspect of this invention relates to the more general use of germanium-containing porous release layers. While such layers can be used (as described above in connection with porous release layer 120) to facilitate the transfer of a device-containing device layer 140 to a second substrate 150, these germanium-containing porous layers can also be used to transfer device layers 140 not containing devices to a second substrate 150. In particular, these germanium-containing porous layers can be used as a substitute for porous Si in the conventional ELTRAN process shown in FIGS. 1A–1G.

Figure 1E:
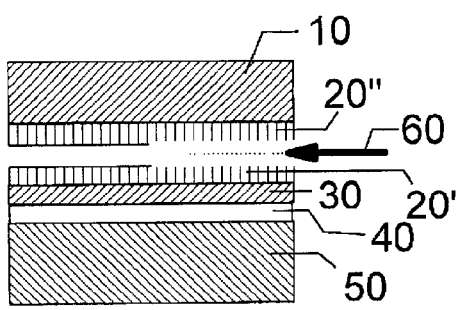
Figure 1F:
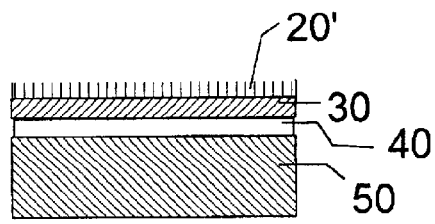
Figure 1G:
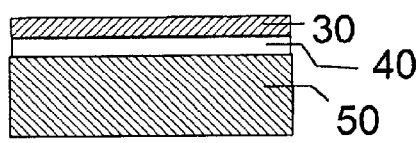
Figures 3A, 3B:
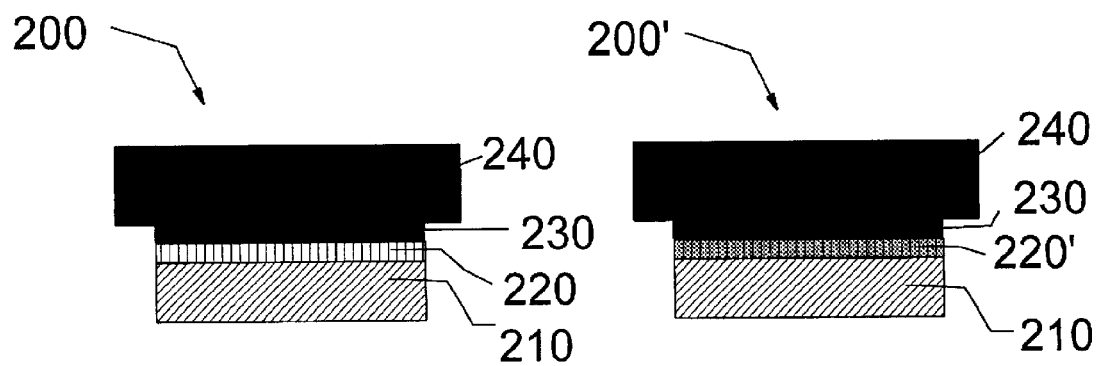
FIGS. 3A–3E show in cross section view the steps of a freeze-thaw method for separating a semiconductor layer from a seed wafer substrate by breaking apart a porous layer by which the semiconducting layer and seed wafer substrate are initially connected.

The invention further provides a freeze-thaw method as an alternative or enhancement to the water jet method of FIGS. 1E and 2G for splitting or breaking apart a porous layer 120 to separate a device layer 140 (which may or may not have devices in it) from a first substrate 110. The steps of this freeze-thaw method are shown in cross section view in FIGS. 3A–3E. FIG. 3A shows bonded assembly 200 with first substrate 210, and porous overlayer 220 between first substrate 210 and layer 230. First substrate 210 would typically be a crystalline semiconductor seed substrate. Porous overlayer 220 would typically be at least partially crystalline, and formed from first substrate 210 by a process such as anodic etching or etching through a patterned mask, for example by reactive ion etching (RIE) through a mask formed from a self-assembled nanoparticles. Layer 230 would typically be a semiconductor device layer. Layer 230 is then bonded by bonding methods known in the art to second substrate 240, typically a semiconductor handle wafer, to form bonded assembly 200. The bonding methods may utilize adhesives and/or oxide bonding layers on one or both of the surfaces to be bonded.

Figure 3C:
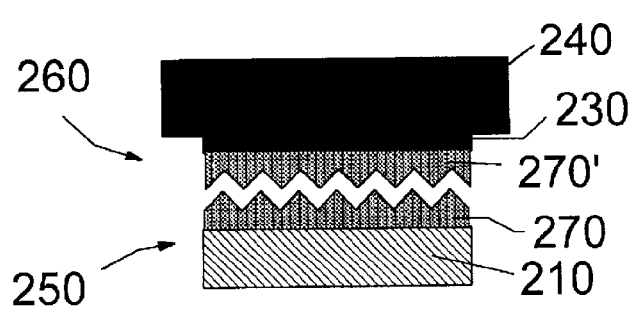
Figure 3D:
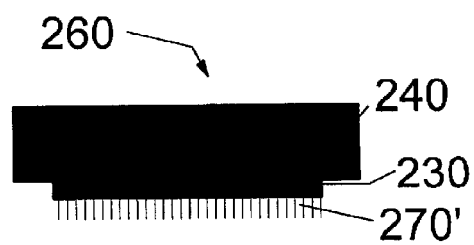
Figure 3E:
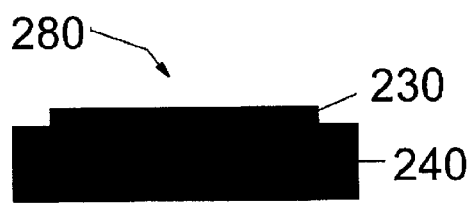

A fluid which expands in volume upon freezing (or solidifying) is then introduced into the pores of porous layer 220 to form bonded assembly 200' of FIG. 3B with fluid-containing porous layer 220'. The fluid may be introduced in liquid form (by immersing the bonded assembly in the fluid) or in gaseous form (by exposing the bonded assembly to a vapor of the fluid). A preferable fluid is liquid water ($H_2O$). Bonded assembly 200' is then cooled to freeze (or solidify) and expand the fluid in porous layer 220', fracturing porous layer 220' and separating bonded assembly into piece 250 comprising first substrate 210, and piece 260, comprising second substrate 240 and layer 230, as shown in FIG. 3C. Residual layers of the split or fractured porous layer 220', shown as layers 270 and 270' in FIG. 3C, may or may not be present. FIG. 3D shows piece 260 after thawing, with dried porous residual layer 270' which also may or may not be present. After removal of porous residuals 270' (if present), from piece 260 by, for example, a process such as chemical mechanical polishing, one obtains the desired structure 280 shown in FIG. 3E comprising second substrate 240 and transferred layer 230.

If pieces 250 and 260 are not completely separated after a single freeze-thaw cycle, the steps of fluid introduction, freezing and thawing may be repeated as necessary. Repetition may be especially desirable if slow fluid penetration rates keep the fluid from reaching the center of the wafer in a reasonable time. In this case, fluid introduction would proceed in a stepwise fashion from the edge of the wafer, and the damage front from each freeze-thaw cycle would progressively advance from the wafer edge to the wafer center until the porous layer is broken apart throughout its entire area.

Figure 4:
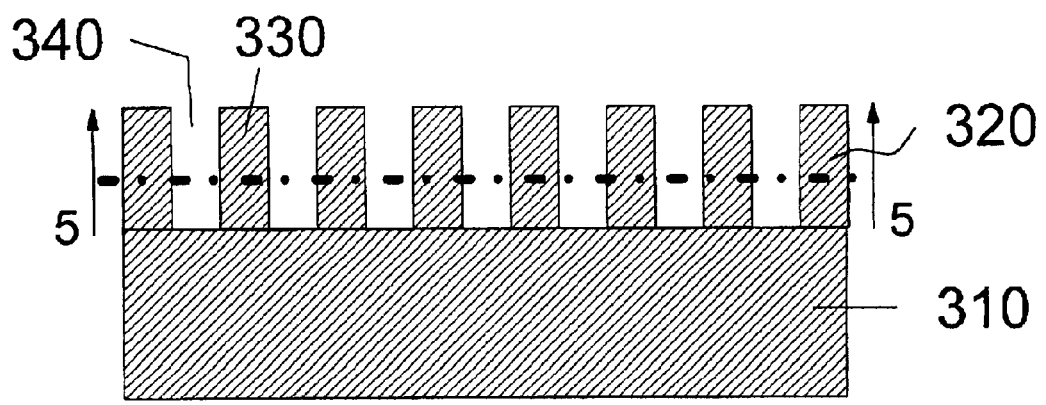
FIG. 4 is a cross section view of an open porosity layer on a substrate.
Figure 5:
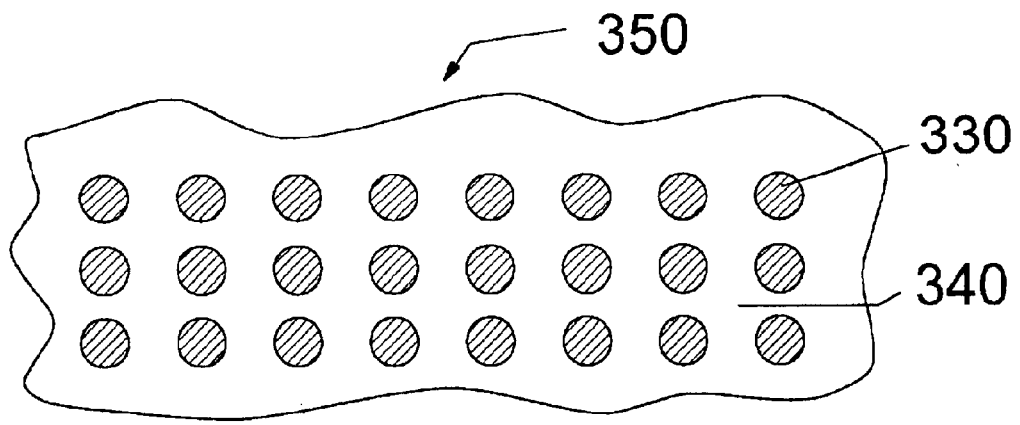
FIG. 5 is a cross section view along the lines 5—5 of FIG. 4 showing a porous layer.
Figure 6:
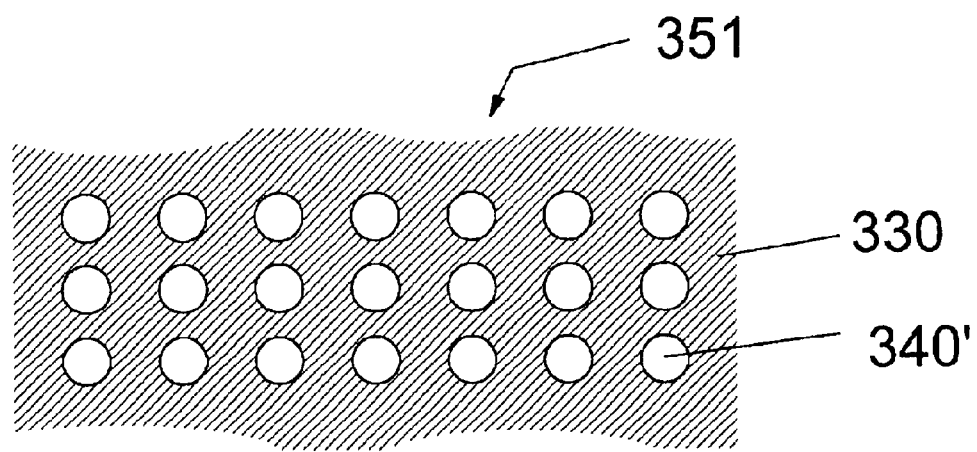
FIG. 6 is a cross section view similar to the view along the lines 5—5 of FIG. 4 except a closed porosity layer is shown in place of an open porosity layer.

Because the freeze-thaw method requires that fluid be introduced to or penetrate into pores 340 of porous layer 220, the porous layer 220 must have an open porosity. Open and closed porosity layers are illustrated in FIGS. 4–6. FIG. 4 shows a cross section view of substrate 310 and porous layer 320. Porous layer 320 has solid regions 330 and pore regions 340. FIG. 5 is a cross section view along the lines 5—5 of FIG. 4, showing horizontal slice 350 through porous layer 320, where porous layer 320 has open porosity shown by pores 340 and solid regions 330. FIG. 6 is a cross section view along the lines 5—5 of FIG. 4, showing a horizontal slice 351 through porous layer 320, where porous layer 320 has closed porosity shown by pores 340' and solid regions 330'.

The freezing step of the freeze-thaw method should be performed in such a manner as to minimize fluid escape during freezing. If the freezing or solidifying process is slow relative to the fluid escape rate, it may be necessary to mechanically trap the fluid in porous layer 320 by temporarily sealing the wafer edges. Preferred, relatively high speed, freezing methods include (i) vacuum freeze drying of wafer assemblies having dry surfaces, (ii) vacuum freeze drying of wafer assemblies having wet surfaces (to enhance evaporative cooling), and (iii) immersing wafer assemblies in low temperature baths of liquid nitrogen, saltwater/ice, or acetone/dry ice. For immersion freezing, the wafer assembly can be enclosed in a flexible and conformable environmental barrier such as a plastic bag to prevent cross contamination of the bath fluid with the fluid in pores 340.

It should be noted that this freeze-thaw method of semiconductor layer separation is only one example of a general class of methods relying on the force of phase-transition-induced volume changes to drive layer separation. For example, a fluid may be introduced into the pores of the porous layer and expanded by a sudden phase transformation to a gas. Suitable fluids for this application include cryogenic liquids (such as liquid nitrogen) which may be converted to a gas by warming to room temperature, and supercritical fluids (such as supercritical $CO_2$) which may be expanded to a gas by reducing the ambient pressure.

While the present invention has been described in an illustrative manner, it should be understood that the terminology used is intended to be in a nature of words of description rather than of limitation. Furthermore, while the present invention has been described in terms of several preferred embodiments, it is to be appreciated that those skilled in the art will readily apply these teachings to other possible variations of the inventions.

Having thus described our invention, what we claim as new and desire to secure by Letters Patent is:

1. A method for forming an integrated circuit on a final substrate comprising the steps of:
   selecting a first substrate including a base substrate and an at least partially crystalline porous release layer;
   forming a semiconductor layer on said porous release layer on said first substrate, said semiconductor layer having a bottom surface in contact with said porous release layer and an upper surface;
   forming at least one semiconductor device in said upper surface of said semiconductor layer;
   bonding said upper surface of said semiconductor layer to a temporary auxiliary substrate;
   detaching said semiconductor layer from said first substrate by breaking apart said porous release layer;
   bonding said bottom surface of said semiconductor layer to a final substrate; and
   detaching said semiconductor layer from said temporary auxiliary substrate.

2. The method of claim 1 wherein said step of bonding to said temporary auxiliary substrate includes the step of forming an adhesive layer.

3. The method of claim 1 wherein said step of bonding to said final substrate includes the step of forming an adhesive layer.

4. The method of claim 1 wherein said at least one semiconductor device is selected from the group consisting of n-type metal-oxide-semiconductor devices (NMOS), p-type MOS (PMOS) devices, complementary MOS (CMOS) devices, bipolar transistors, bipolar and CMOS (BiCMOS) devices.

5. The method of claim 1 wherein said step of forming at least one semiconductor device further includes the step of forming insulating regions extending through said semiconductor layer.

6. The method of claim 1 wherein said semiconductor layer containing at least one semiconductor device further includes additional layers containing interconnection circuitry.

7. The method of claim 1 wherein said semiconducting layer is selected from the group consisting of silicon, silicon-germanium alloys, silicon-carbon alloys, silicon-germanium alloys containing carbon; the aforementioned materials doped with any element; the aforementioned materials in layered or graded composition combinations; the aforementioned materials in single crystal, polycrystalline, or nanocrystalline form.

8. The method of claim 1 wherein said semiconductor layer has a thickness in the range from 20 to 1000 nm.

9. The method of claim 1 wherein said final substrate further includes the step of forming one of passive cooling and active cooling.

10. The method of claim 1 wherein said final substrate is selected from the group consisting of single crystal silicon, diamond, quartz, crystalline oxides, crystalline or amorphous nitrides, amorphous or glassy oxides, plastics, and organic-inorganic composites.

11. The method of claim 1 wherein said final substrate comprises a base substrate with one or more overlayers selected from the group consisting of highly insulating (>1 k$\Omega$-cm) single-crystal Si, highly insulating (>1 k$\Omega$-cm) single-crystal silicon germanium, highly insulating (>1 k$\Omega$-cm) polycrystalline Si or highly insulating (>1 k$\Omega$-cm) polycrystalline silicon germanium, single crystal diamond, polycrystalline diamond; silicon oxide; aluminum oxide, other metal oxides, aluminum nitride, other crystalline or amorphous nitrides, and mixtures thereof.

12. The method of claim 11 wherein said base substrate is selected from the group consisting of single crystal silicon, diamond, crystalline oxides, crystalline or amorphous nitrides, amorphous or glassy oxides, plastics, and organic-inorganic composites.

13. The method of claim 1 wherein said at least partially crystalline porous layer is selected from the group consisting of at least one porous silicon germanium alloy layer ($Si_{1-x}Ge_x$, where $0<x<1$ and x may be constant or spatially variable) and at least one porous silicon germanium alloy layer in combination with porous Si.

14. A method for forming an integrated circuit on a final substrate comprising the steps of: forming a semiconductor layer on a first substrate, said first substrate comprising a base substrate and an at least partially crystalline porous release layer;

processing said semiconductor layer to form at least one semiconductor device;

bonding said semiconductor layer to a final substrate; and detaching said semiconductor layer from said first substrate by breaking apart said porous release layer.

15. The method of claim 14 wherein said step of bonding to said final substrate includes the step of forming an adhesive layer.

16. The method of claim 14 wherein said at least one semiconductor device is selected from the group consisting of n-type metal-oxide-semiconductor devices (NMOS), p-type MOS (PMOS) devices, complementary MOS (CMOS) devices, bipolar transistors, bipolar and CMOS (BiCMOS) devices.

17. The method of claim 1 wherein said step of forming at least one semiconductor device further includes the step of forming insulating regions extending through said semiconductor layer.

18. The method of claim 14 wherein said semiconductor layer containing at least one semiconductor device further includes additional layers containing interconnection circuitry.

19. The method of claim 14 wherein said semiconducting layer is selected from the group consisting of silicon, silicon-germanium alloys, silicon-carbon alloys, silicon-germanium alloys containing carbon; the aforementioned materials doped with any element; the aforementioned materials in layered or graded composition combinations; the aforementioned materials in single crystal, polycrystalline, or nanocrystalline form.

20. The method of claim 14 wherein said semiconductor layer has a thickness in the range from 20 to 1000 nm.

21. The method of claim 14 wherein said final substrate further includes the step of forming one of passive cooling and active cooling.

22. The method of claim 14 wherein said final substrate is selected from the group consisting of single crystal silicon, diamond, quartz, crystalline oxides, crystalline or amorphous nitrides, amorphous or glassy oxides, plastics, and organic-inorganic composites.

23. The method of claim 14 wherein said final substrate comprises a base substrate with one or more overlayers selected from the group consisting of highly insulating (>1 kΩ-cm) single-crystal Si, highly insulating (>1 kΩ-cm) single-crystal silicon germanium, highly insulating (>1 kΩ-cm) polycrystalline Si or highly insulating (>1 kΩ-cm) polycrystalline silicon germanium, single crystal diamond, polycrystalline diamond; silicon oxide; aluminum oxide, other metal oxides, aluminum nitride, other crystalline or amorphous nitrides, and mixtures thereof.

24. The method of claim 23 wherein said base substrate is selected from the group consisting of single crystal silicon, diamond, crystalline oxides, aluminum nitride, other crystalline or amorphous nitrides, amorphous or glassy oxides, plastics, and organic-inorganic composites.

25. The method of claim 14 wherein said at least partially crystalline porous layer is selected from the group consisting of at least one porous silicon germanium alloy layer ($Si_{1-x}Ge_x$, where $0<x<1$ and x may be constant or spatially variable) and at least one porous silicon germanium alloy layer in combination with porous Si.

26. A method for forming and detaching a semiconductor device layer comprising the steps of:

forming a semiconductor layer on a first substrate, wherein said first substrate includes a base substrate and an at least partially crystalline porous release layer, and said at least partially crystalline porous release layer includes at least one porous silicon germanium alloy layer ($Si_{1-x}Ge_x$, where $0<x<1$ and x may be constant or spatially variable) alone or in combination with at least one porous Si layer; and detaching said semiconductor layer from said first substrate by breaking apart said porous release layer.

27. A method for detaching a layer from a semiconductor substrate, said layer initially attached to said semiconductor substrate by a porous layer which is broken apart by the steps of:

introducing a fluid including water into the pores of said porous layer; and freezing said fluid whereby said fluid expands to break apart said porous layer.

28. The method of claim 27 wherein said steps are repeated in one or more freeze-thaw cycles.

29. The method of claim 27 wherein said semiconductor substrate is a crystalline semiconductor substrate, and said porous release layer is at least partially crystalline and formed by the steps of anodic etching of said crystalline semiconductor substrate.

30. The method of claim 27 wherein said semiconductor substrate is a crystalline semiconductor substrate, and said porous release layer is at least partially crystalline and formed by the steps of through a patterned mask.

* * * * *